United States Patent
Ezaki et al.

(10) Patent No.: US 7,227,771 B2
(45) Date of Patent: Jun. 5, 2007

(54) MAGNETORESISTIVE EFFECT ELEMENT AND MAGNETIC MEMORY DEVICE

(75) Inventors: Joichiro Ezaki, Tokyo (JP); Keiji Koga, Tokyo (JP); Yuji Kakinuma, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/548,830

(22) PCT Filed: Mar. 12, 2004

(86) PCT No.: PCT/JP2004/003364

§ 371 (c)(1),
(2), (4) Date: Sep. 13, 2005

(87) PCT Pub. No.: WO2004/082026

PCT Pub. Date: Sep. 23, 2004

(65) Prior Publication Data

US 2006/0193165 A1    Aug. 31, 2006

(30) Foreign Application Priority Data

Mar. 14, 2003   (JP)   ............................. 2003-069194

(51) Int. Cl.
*G11C 11/00*  (2006.01)

(52) U.S. Cl. ..................... 365/158; 365/171; 365/173

(58) Field of Classification Search ................ 365/158, 365/171, 173, 61; 257/295, E21.665, E27.005
See application file for complete search history.

(56) References Cited

U.S. PATENT DOCUMENTS

| | | | |
|---|---|---|---|
| 5,343,422 A | 8/1994 | Kung et al. | |
| 5,587,943 A | 12/1996 | Torok et al. | |
| 5,629,922 A | 5/1997 | Moodera et al. | |
| 5,861,328 A | 1/1999 | Tehrani et al. | |
| 6,396,734 B2 * | 5/2002 | Ishikawa et al. | ............ 365/158 |
| 6,404,674 B1 | 6/2002 | Anthony et al. | |
| 6,556,473 B2 * | 4/2003 | Saito et al. | .................. 365/158 |

(Continued)

FOREIGN PATENT DOCUMENTS

JP    9-91949    4/1997

(Continued)

OTHER PUBLICATIONS

English Language Abstract of JP 09-091949.

(Continued)

*Primary Examiner*—David Lam
(74) *Attorney, Agent, or Firm*—Greenblum & Bernstein, P.L.C.

(57) ABSTRACT

A magnetoresistive effect element includes a TMR element disposed at an intersection where a bit line and a write word line intersect, in a manner sandwiched between the bit line and the write word line, and is configured such that it includes a sensitive magnetic layer whose magnetization direction is changed by a synthetic magnetic field of magnetic fields generated around the bit line and the write word line, and at the same time such that electric current flows in a direction perpendicular to the laminating surfaces thereof, and a magnetic material individually covering the bit line and the write word line at the intersection, thereby forming an annular magnetic layer associated with the bit line and an annular magnetic layer associated with the write word line.

2 Claims, 7 Drawing Sheets

U.S. PATENT DOCUMENTS 6,853,580 B2 * 2/2005 Nishimura .................. 365/158
2002/0034094 A1 3/2002 Saito et al.

FOREIGN PATENT DOCUMENTS

| JP | 2000-90658 | 3/2000 |
|---|---|---|
| JP | 2001-168417 | 6/2001 |
| JP | 2001-230468 | 8/2001 |
| JP | 2001-230469 | 8/2001 |
| JP | 2001-230472 | 8/2001 |
| JP | 2002-246566 | 8/2002 |
| JP | 2002-110938 | 12/2002 |
| JP | 2003 7985 | 1/2003 |
| JP | 2003-258209 | 9/2003 |
| JP | 2004-111887 | 4/2004 |
| JP | 2004-119638 | 4/2004 |

OTHER PUBLICATIONS

English Language Abstract of JP 2002-110938.
English Language Abstract of JP 2002-246566.
English Language Abstract of JP 2003-007985.
English Language Abstract of JP 2003-258209.
English Language Abstract of JP 2004-111887.
English Language Abstract of JP 2004-119638.
English Language Abstract of JP2000-090658.
English Language Abstract of JP2001-168417.
English Language Abstract of JP2001-230468.
English Language Abstract of JP2001-230469.
English Language Abstract of JP2001-230472.

* cited by examiner

MAGNETORESISTIVE EFFECT ELEMENT AND MAGNETIC MEMORY DEVICE

TECHNICAL FIELD

This invention relates to a magnetoresistive effect element including a ferromagnetic material whose magnetization direction is changed by an external magnetic field, and a magnetic memory device that stores information using the change in the magnetization direction.

BACKGROUND ART

As a magnetic memory device using a magnetoresistive effect element of the above-mentioned kind, there has been known a magnetic random access memory (hereinafter also referred to as "the MRAM"). The MRAM stores information using a combination (parallel or antiparallel) of the respective magnetization directions of two ferromagnetic materials included in the magnetoresistive effect element. On the other hand, reading of the stored information is carried out by detecting a change in the resistance value of the magnetoresistive effect element (i.e. a change in electric current or voltage), which changes depending on whether the magnetization directions of the two ferromagnetic materials are parallel or antiparallel to each other.

MRAMs currently operative make use of a giant magnetoresistive (GMR) effect. An MRAM using GMR elements capable of providing the GMR effect is disclosed in U.S. Pat. No. 5,343,422. In this case, the GMR effect is intended to mean a phenomenon that the resistance value becomes minimum when the magnetization directions of two magnetic layers parallel to each other along the easy axis of magnetization are parallel to each other, whereas when the magnetization directions of the two magnetic layers are antiparallel to each other, the resistance value becomes maximum. As MRAMs using the GMR element, there are a coercive force difference type (pseudo spin valve type) MRAM and a switching bias type (spin valve type) MRAM. The coercive force difference type MRAM uses a GMR element having two ferromagnetic layers and a non-magnetic layer sandwiched therebetween, and makes use of the coercive force difference between the two ferromagnetic materials to thereby have information written therein and read out therefrom. Now, assuming that a GMR element is composed e.g. of "nickel-iron alloy (NiFe)/copper (Cu)/cobalt (Co)", the rate of change in resistance of the element assumes a small value of approximately 6 to 8%. On the other hand, the switching bias type MRAM uses a GMR element having a fixed layer whose magnetization direction is fixed by exchange-coupling with an antiferromagnetic layer, a sensitive magnetic layer whose magnetization direction is changed by an external magnetic field, and a non-magnetic layer sandwiched therebetween, and makes use of the difference between the respective magnetization directions of the fixed layer and the sensitive magnetic layer to thereby have information written therein and read out therefrom. For example, assuming that a GMR element is composed e.g. of "platinum manganese (PtMn)/cobalt iron (CoFe)/copper (Cu)/CoFe", the rate of change in resistance of the GMR element assumes a value of approximately 10%. This value is larger than the rate of change in resistance of the coercive force difference type MRAM, but insufficient to further enhance the recording speed and the access speed of the GMR element.

Figure 11:
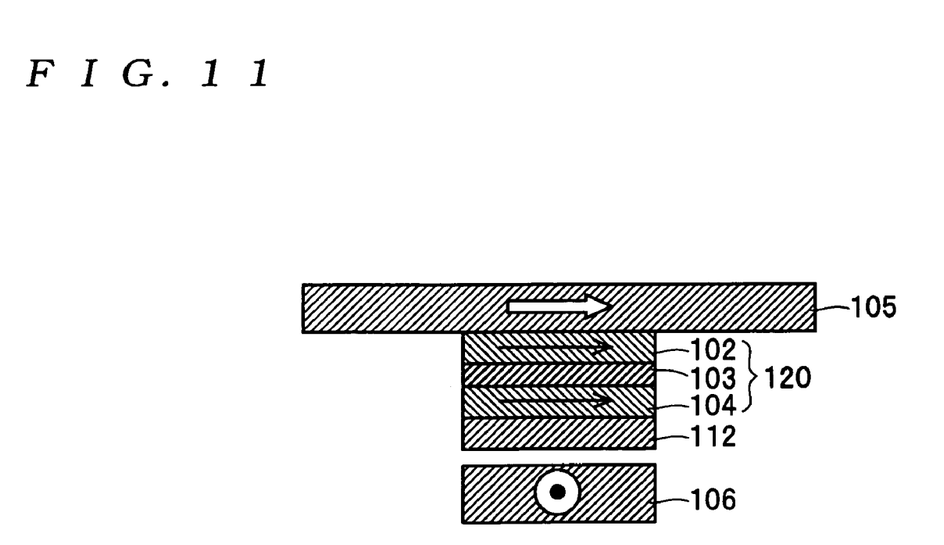
FIG. 11 is a cross-sectional view of a TMR element 120 as a conventional storage cell, taken along a bit line 105.
Figure 12:
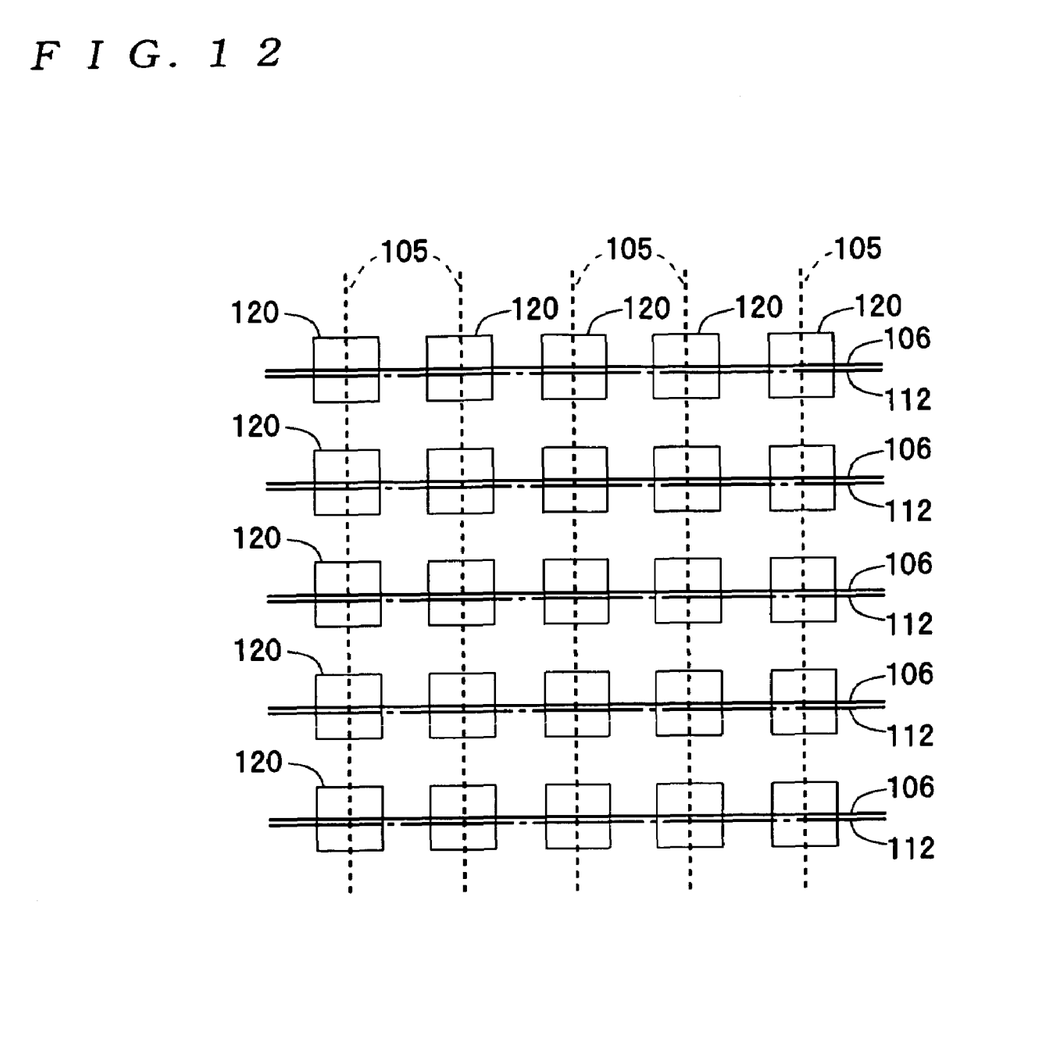
FIG. 12 is a plan view showing the arrangement of a magnetic memory device employing the storage cell shown in FIG. 11.

To solve the above problems, there has been proposed an MRAM which uses magnetoresistive effect elements (hereinafter also referred to as "the TMR elements") 120 constructed as shown in FIG. 11 for utilizing a tunnel magnetoresistive effect (hereinafter also referred to as "the TMR effect"), as storage cells. As shown in FIG. 12, this MRAM is comprised of a plurality of bit lines 105 arranged in parallel to each other, a plurality of write word lines 106 arranged in parallel to each other, and at the same time orthogonal to the bit lines 105, a plurality of read word lines 112 arranged along the write word lines 106, and a plurality of TMR elements 120 arranged at orthogonally crossing portions (intersections) where the bit lines 105 and the write word lines 106 orthogonally intersect with each other, in a manner sandwiched therebetween. In this case, as shown in FIG. 11, each TMR element 120 is comprised of a first magnetic layer 102, a tunnel barrier layer 103, and a sensitive magnetic layer 104 as a second magnetic layer, which are sequentially deposited in the mentioned order.

In this case, the TMR effect is intended to mean an effect that a tunnel current flowing through the tunnel barrier layer 103 varies with a relative angle between the respective magnetization directions of the first magnetic layer 102 and the sensitive magnetic layer 104 as two ferromagnetic layers sandwiching the tunnel barrier layer 103 as a very thin insulating layer (non-magnetic conductive layer). More specifically, the resistance value becomes minimum when the magnetization directions of the first magnetic layer 102 and the sensitive magnetic layer 104 are parallel to each other, whereas when they are antiparallel to each other, the resistance value becomes maximum. Further, in the MRAM making use of the TMR effect, when the TMR element 120 is composed e.g. of "CoFe/aluminum oxide/CoFe", the rate of change in resistance of the MRAM assumes a high value of approximately 40%, and the resistance value thereof is large, and hence it is easy to match the MRAM with a semiconductor device, such as a MOSFET or the like, when they are combined with each other. This makes it possible to easily obtain a higher output compared with the MRAM including the GMR element, and enhancement of the storage capacity and the access speed is expected. The MRAM making use of the TMR effect stores information by changing the magnetization direction of the sensitive magnetic layer 104 of the TMR element 120 to a predetermined direction, using current magnetic fields generated by electric current caused to flow through the bit lines 105 and the write word lines 106. On the other hand, to read out information stored in the MRAM, electric current in a direction perpendicular to the tunnel barrier layer 103 is caused to flow through the TMR element 120 via the bit lines 105 and the read word lines 112, to thereby detect a change in the resistance of the TMR element 120. It should be noted that the MRAM utilizing the TMR effect is disclosed in U.S. Pat. No. 5,629,922, or in Japanese Laid-Open Patent Publication (Kokai) No. H09-91949.

DISCLOSURE OF THE INVENTION

From the study of the above-described MRAM using the magnetoresistive effect element, the present inventors found out the following problems: In the MRAM, information is stored in the TMR elements 120 as storage cells by changing the magnetization direction of each sensitive magnetic layer 104 using induction fields (i.e. current magnetic fields) generated by electric currents flowing through the bit line 105 and the write word line 106 arranged orthogonal to each other. However, the MRAM suffers from the problem that writing efficiency thereof is low due to high leakage fluxes caused by the current magnetic fields being open magnetic fields (which are not magnetically confined within respective particular regions). At the same time, there is a concern that adjacent TMR elements 120 are adversely affected by the leakage fluxes.

Further, to attain higher integration of the TMR elements 120 to thereby realize an even higher-density MRAM, it is necessary to make each TMR element 120 very small in size. On the other hand, when the TMR element 120 is made very small in size, demagnetizing fields increase due to an increase in the ratio of thickness of each of the magnetic layers 102 and 104 of the TMR element 120 to width of the same in the direction along the laminating surfaces of the magnetic layers, so that the intensity of the magnetic fields required to change the magnetization direction of the sensitive magnetic layer increases. However, as described hereinabove, the writing efficiency becomes low since the current magnetic fields generated by electric currents flowing through the bit line 105 and the write word line 106 are open magnetic fields, so that when information is recorded by changing the magnetization direction of the sensitive magnetic layer, it is necessary to cause a large write current to flow, which is also a problem.

The present invention has been made to solve the problems described above, and a main object thereof is to provide a magnetoresistive effect element which is capable of efficiently generating a magnetic field within a sensitive magnetic layer to thereby enhance writing efficiency. Further, another main object thereof is to provide a magnetic memory device which is capable of efficiently recording information with a small write current, and what is more, lowering adverse influence on adjacent magnetoresistive effect elements when information is written therein.

The magnetoresistive effect element according to the present invention comprises a laminate that is disposed at an intersection where a first write line and a second write line intersect with each other, in a manner sandwiched between the first write line and the second write line, the laminate including a sensitive magnetic layer whose magnetization direction is changed by a synthetic magnetic field of magnetic fields generated around the first write line and the second write line, and at the same time being configured such that electric current flows in a direction perpendicular to laminating surfaces thereof, and a magnetic material that individually covers the first write line and the second write line at the intersection, thereby forming an annular magnetic layer associated with the first write line and an annular magnetic layer associated with the second write line, wherein the sensitive magnetic layer includes a shared portion of the annular magnetic layers of the magnetic material, the shared portion being sandwiched by the first write line and the second write line.

According to this magnetoresistive effect element, there is disposed a magnetic material that individually covers a first write line and a second write line at an intersection where the first write line and the second write line intersect with each other, thereby forming an annular magnetic layer associated with the first write line and an annular magnetic layer associated with the second write line, and a sensitive magnetic layer is configured to include a shared portion of the annular magnetic layers. This makes it possible to confine magnetic fluxes generated around the first and second write lines by electric currents flowing therethrough within closed magnetic circuits formed by the respective annular magnetic layers. Therefore, it is possible to reduce occurrence of leakage fluxes, thereby making it possible to largely reduce adverse influence of leakage fluxes on adjacent magnetoresistive effect elements. Further, since the occurrence of leakage fluxes can be reduced, magnetic fields can be efficiently generated within the sensitive magnetic layer by the internal magnetic flux of the magnetic material increased in density. This makes it possible to efficiently change the magnetization direction of the sensitive magnetic layer with smaller electric currents. In short, it is possible to efficiently generate magnetic fields within the sensitive magnetic layer to sufficiently enhance writing efficiency.

In this case, it is preferable that the sensitive magnetic layer includes a magnetic layer magnetically exchange-coupled with the shared portion. This construction makes it possible to select a material having a high polarizability as a material for forming the magnetic layer which is one of the members for forming the sensitive magnetic layer, and hence it is possible to increase the rate of change in MR of the magnetoresistive effect element. Further, by forming the magnetic layer with a material having a larger coercive force than that of the shared portion, it is possible to make the magnetization direction of the magnetic layer more stable. As a result, it is possible to further stabilize the magnetization direction of the whole sensitive magnetic layer.

Further, it is preferable that the sensitive magnetic layer is formed by depositing a non-magnetic conductive layer and a magnetic layer in the mentioned order on the shared portion, the magnetic layer being configured to be capable of being antiferromagnetically coupled with the shared portion. Since the magnetic layer configured to be capable of being antiferromagnetically coupled with the shared portion of the annular magnetic layers is disposed in the sensitive magnetic layer, as described above, it is possible to make the magnetization direction of the magnetic layer still more stable. As a result, it is possible to stabilize the magnetization direction of the whole sensitive magnetic layer.

Furthermore, it is preferable that the sensitive magnetic layer is electrically connected to either the annular magnetic layer associated with the first write line or the annular magnetic layer associated with the second write line. This construction makes it possible to connect the magnetoresistive effect element and a read line to each other by way of the magnetic material, and hence the construction of the magnetoresistive effect element can be simplified, thereby making it possible to realize a high-density storage element.

Further, it is also possible to construct the laminate including a non-magnetic layer, a first magnetic layer deposited on one side of the non-magnetic layer and having a fixed magnetization direction, and the sensitive magnetic layer deposited on the side of the non-magnetic layer opposite from the first magnetic layer, such that information can be read out from the laminate based on the electric current.

Furthermore, it is preferable that the first magnetic layer has a larger coercive force than that of the sensitive magnetic layer. With this construction, the magnetization direction of the first magnetic layer can be held fixed.

Further, it is preferable that the laminate includes a second magnetic layer that is deposited on a side of the first magnetic layer opposite from the non-magnetic layer and is exchange-coupled with the first magnetic layer, the second magnetic layer having an antiferromagnetic property. As described above, the second magnetic layer that has an antiferromagnetic property, and is exchange-coupled with the first magnetic layer is deposited on a side of the first magnetic layer opposite from the non-magnetic layer, whereby the laminate is formed to have a spin valve structure. As a result, the magnetization direction of the first magnetic layer can be more stably held fixed.

Further, it is preferable that the laminate includes a third magnetic layer that is deposited on a side of the first magnetic layer opposite from the non-magnetic layer via a non-magnetic conductive layer and is antiferromagnetically coupled with the first magnetic layer, the third magnetic layer having a ferromagnetic property, and a fourth magnetic layer that is deposited on a side of the third magnetic layer opposite from the first magnetic layer and is exchange-coupled with the third magnetic layer, the fourth magnetic layer having an antiferromagnetic property. This construction makes it possible to reduce the influence of a static magnetic field from the first magnetic layer to the sensitive magnetic layer, thereby making it possible to efficiently change the magnetization direction of the sensitive magnetic layer. Further, since the magnetization direction of the first magnetic layer can be more stably held fixed, it is possible to increase the rate of change in MR of the magnetoresistive effect element.

Furthermore, it is also possible to form the non-magnetic layer by an insulating layer capable of causing a tunnel effect.

A magnetic memory device according to the present invention comprises a plurality of the magnetoresistive effect elements as recited in any one of the above descriptions, a plurality of the first write lines, and a plurality of the second write lines arranged in a manner intersecting with the first write lines, wherein the magnetoresistive effect elements are each arranged at the intersection where the first write line and the second write line intersect with each other, in a manner sandwiched between the first write line and the second write line.

According to this magnetic memory device, the magnetoresistive effect elements are each arranged at the intersection where the first write line and the second write line intersect with each other, in a manner sandwiched between the first write line and the second write line, whereby it is possible to confine magnetic fluxes generated around the respective write lines, and hence reduce occurrence of leakage fluxes. As a result, it is possible to largely reduce adverse influence of leakage fluxes on adjacent magnetoresistive effect elements. Therefore, it is possible to realize high-density magnetoresistive effect elements. Further, since occurrence of leakage fluxes can be reduced, the internal magnetic flux of the magnetic material increased in density can be efficiently transmitted to the sensitive magnetic layer. As a result, it is possible to efficiently change the magnetization direction of the sensitive magnetic layer with a smaller electric current. That is, information can be efficiently recorded with a small write current. Therefore, even when a demagnetizing field is increased by downsizing (making very small) of the magnetoresistive effect element, it is possible to record information reliably without passing a large write current.

In this case, it is also possible to arrange a plurality of read lines in the magnetic memory device, for passing the electric current through the laminate to configure the magnetic memory device such that it can read out information based on the electric current.

It should be noted that the present disclosure relates to the subject matter included in Japanese Patent Application No. 2003-069194 filed Mar. 14, 2003, and it is apparent that all the disclosures therein are incorporated herein by reference.

BEST MODE FOR CARRYING OUT THE INVENTION

Hereinafter, an embodiment of the present invention will be described in detail with reference to the drawings.

Figure 1:
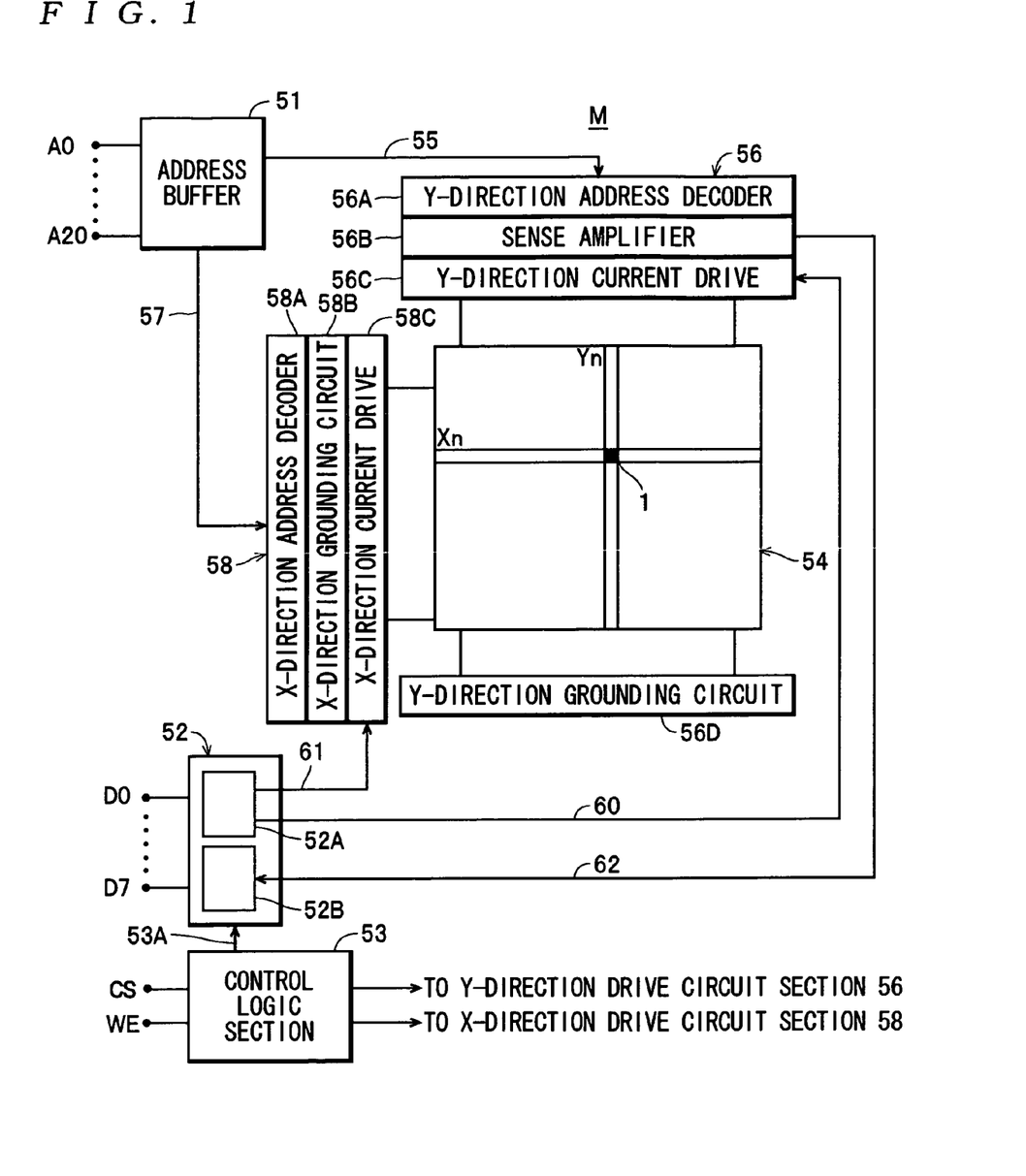
FIG. 1 is a block diagram showing the whole arrangement of a magnetic memory device M according to the present invention.

Referring first to FIG. 1, a description will be given of the construction of a magnetic memory device M.

The magnetic memory device M is comprised of an address buffer 51, a data buffer 52, a control logic section 53, a storage cell group 54, a Y-direction drive circuit section 56, and an X-direction drive circuit section 58.

Figure 2:
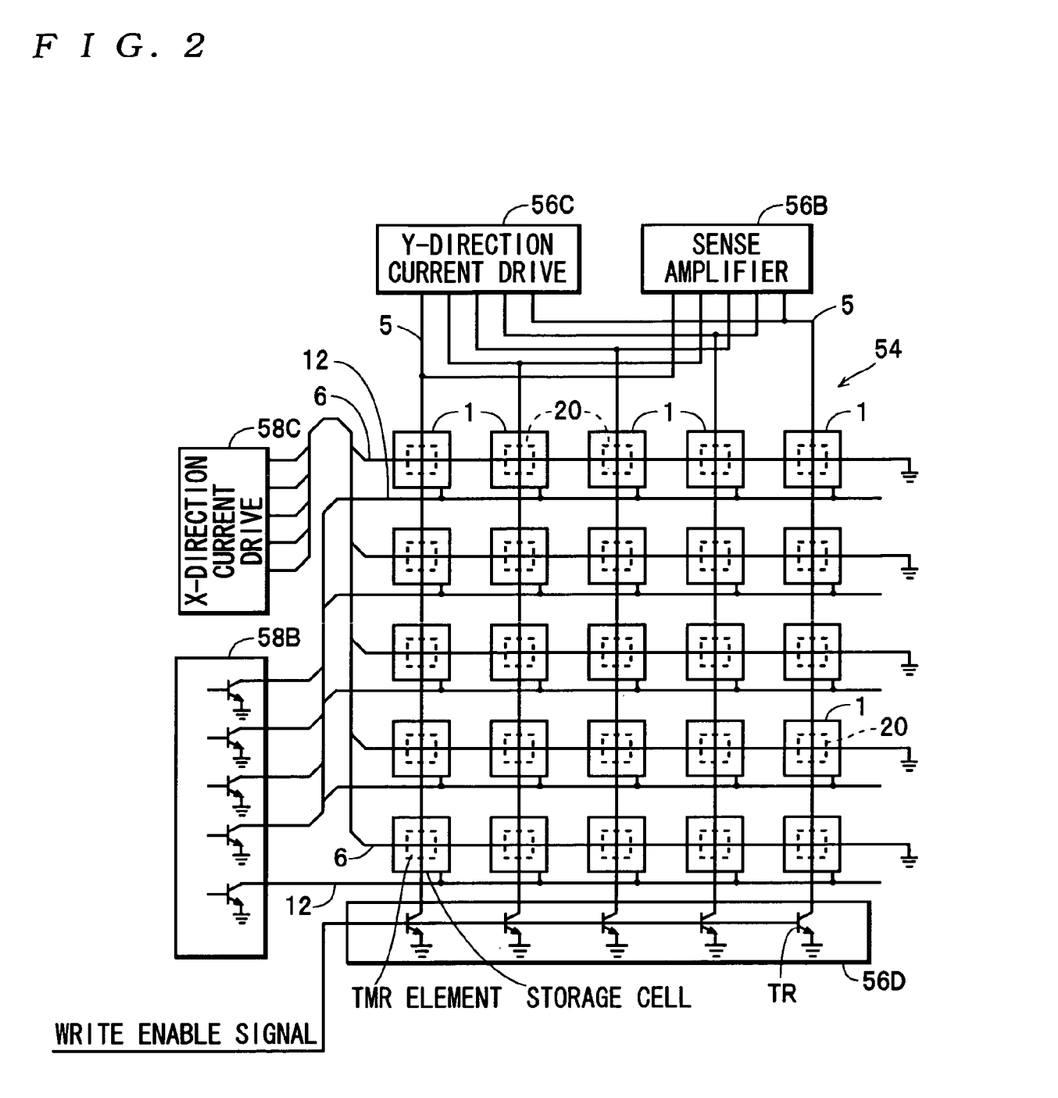
FIG. 2 is a block diagram showing the arrangement of a storage cell group 54 and peripheral circuits connected thereto of the FIG. 1 magnetic memory device M.

As shown in FIGS. 1 and 2, the storage cell group 54 is formed by arranging a large number of storage cells 1 at respective intersections in a matrix defined by rows in a word line direction (the X direction) and columns in a bit line direction (the Y direction). In this case, each storage cell 1 is a minimum unit for storing data, and configured to be capable of storing bit data representing "1" and "0". More specifically, as shown in FIG. 2, each storage cell 1 is comprised of a TMR element 20, and as will be described hereinafter, the bit data are stored in a manner dependent on whether or not directions of magnetization in two magnetic layers of the TMR element 20 are parallel or anti-parallel to each other. It should be noted that throughout the present specification, each row of storage cells 1 of the storage cell group 54 is referred to as a word string Xn (X1, X2, . . . ), and each column of the same as a bit string Yn (Y1, Y2, . . . ). Further, as shown in FIG. 2, a plurality of bit lines 5 arranged along the Y direction, and a plurality of write word lines (second write lines) 6 arranged along the X direction in a manner intersecting the bit lines 5, are wired in the form of a matrix. In this case, each write word line 6 has one end thereof (right end as viewed in FIG. 2) grounded. Further, the storage cells 1 are each arranged in a manner sandwiched between the bit line 5 and the write word line 6 at each of the above intersections. Here, storage cells 1 juxtaposed along a common bit line 5 form the above-described bit string Yn, and storage cells 1 juxtaposed along a common write word line 6 form the above-described word string Xn. Further, in the storage cell group 54, read word lines 12 as read lines are wired in parallel with the respective write word lines 6, and electrically connected to storage cells 1 on the word strings Xn associated therewith. Furthermore, in the magnetic memory device M according to the present embodiment, the bit lines 5 are configured to serve not only as write bit lines (first write lines) but also as read bit lines as read lines.

As shown in FIG. 1, the Y-direction drive circuit section 56 is comprised of a Y-direction address decoder 56A, a sense amplifier 56B for use in reading, a Y-direction current drive 56C for use in writing, and a Y-direction grounding circuit 56D. In this case, the sense amplifier 56B, the Y-direction current drive 56C, and the Y-direction grounding circuit 56D are connected to the storage cell group 54 via each bit string Yn of storage cells 1. More specifically, as shown in FIG. 2, the sense amplifier 56B and the Y-direction current drive 56C are connected to one end (upper end as viewed in FIG. 2) of each bit line 5. Further, the Y-direction grounding circuit 56D is connected to the other end (lower end as viewed in FIG. 2) of each bit line 5. In this case, as shown in FIG. 2, the Y-direction grounding circuit 56D is formed by a plurality of switch elements (NPN transistors TR, by way of example). In the Y-direction grounding circuit 56D, the respective collector terminals of the transistors TR are connected to the respective other ends of the bit lines 5 associated therewith, and the respective emitter terminals of the transistors TR are grounded. Further, the respective base terminals of the transistors TR are commonly connected such that a write enable signal is simultaneously supplied thereto from the control logic section 53.

The X-direction drive circuit section 58 is comprised of an X-direction address decoder 58A, an X-direction grounding circuit 58B for use in reading, and an X-direction current drive 58C for use in writing. In this case, the X-direction grounding circuit 58B and the X-direction current drive 58C are connected to the storage cell group 54 via each word string Xn of storage cells 1. More specifically, as shown in FIG. 2, the X-direction grounding circuit 58B is connected to one end of each read word line 12, and the X-direction current drive 58C is connected to the other end of each write word line 6. Therefore, for example, as shown in FIG. 1, a certain storage cell 1 is uniquely selected by addresses (Xn, Yn) in the word direction and the bit direction output from the X-direction address decoder 58A and the Y-direction address decoder 56A, respectively.

The address buffer 51 includes external address input terminals A0 to A20, and is connected to the Y-direction address decoder 56A and the X-direction address decoder 58A via respective address lines 55 and 57. The address buffer 51 has the function of fetching address data for selecting a storage cell 1 via the external address input terminals A0 to A20 and causing an internal buffer amplifier disposed therein to amplify the address data up to a level of voltage necessitated by the address decoders 56A and 58A. Further, the address buffer 51 divides the input address data into two address data in the direction of the word string Xn and in the direction of the bit string Yn of the storage cell group 54, for delivering the divided address data to the address decoders 56A and 58A, respectively.

The data buffer 52 includes external data terminals D0 to D7, and is connected to the control logic section 53 via a control signal line 53A. Further, the data buffer 52 includes an input buffer 52A and an output buffer 52B operable according to a control signal input from the control logic section 53 via the control signal line 53A. In this case, the input buffer 52A is connected to the Y-direction current drive 56C and the X-direction current drive 58C via data buses 60 and 61 for use in writing, respectively. During writing of data in the magnetic memory device M, the input buffer 52A fetches write data from the external data terminals D0 to D7, amplifies the write data to a necessary level of voltage, and outputs the amplified data to the current drives 56C and 58C. Further, the output buffer 52B is connected to the sense amplifier 56B via a data bus 62 for use in reading. During reading of data from the magnetic memory device M, the output buffer 52B converts readout data output from the sense amplifier 56B into low impedance, and outputs the converted readout data to the external data terminals D0 to D7.

The control logic section 53 includes an input terminal CS and an input terminal WE, and controls operations of the data buffer 52, the Y-direction drive circuit section 56, and the X-direction drive circuit section 58. More specifically, the control logic section 53 determines based on a chip select signal input via the input terminal CS and the write enable signal input via the input terminal WE which of the input buffer 52A and the output buffer 52B should be activated for the data buffer 52. Further, the control logic section 53 amplifies the chip select signal and the write enable signal to a level of voltage necessitated by the drive circuit sections 56 and 58, and outputs the amplified signals to the drive circuit sections 56 and 58.

Next, the configuration of the storage cell 1 will be described with reference to FIG. 3.

Figure 3:
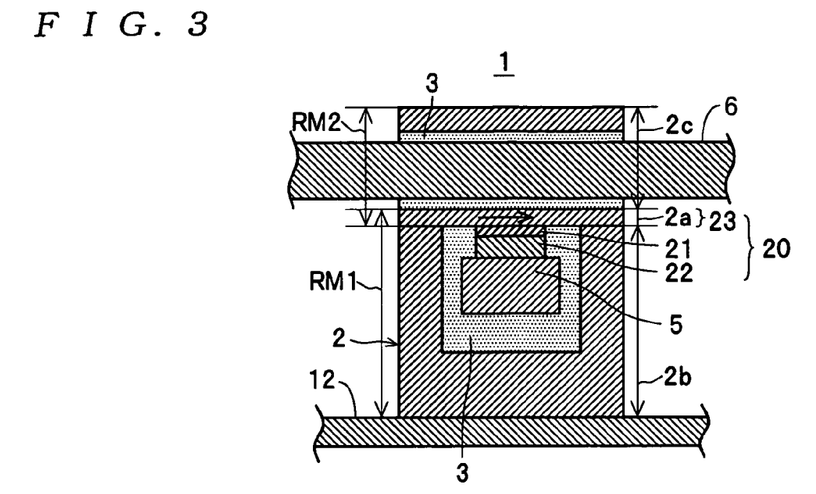
FIG. 3 is a cross-sectional view of a storage cell 1 appearing in FIG. 2, taken along a write word line 6.

As shown in FIG. 3, the storage cell 1 is comprised of a magnetic material 2 and the TMR element 20. In this case, the magnetic material 2 is disposed at each of intersections where the bit lines 5 and the write word lines 6 intersect with each other, and covers the bit line 5 and the write word line 6 individually at each intersection. More specifically, the magnetic material 2 is comprised of a magnetic material portion 2a which is in the form of a flat plate and disposed in a manner sandwiched between the bit line 5 and the write word line 6, a magnetic material portion 2b which is in the form of a gutter (U-shaped), and disposed in a manner surrounding the lower side and the left and right sides of the bit line 5, and a magnetic material portion 2c which is in the form of a gutter (inverted U-shaped) and disposed in a manner displaced from the magnetic material portion 2b by 90 degrees and surrounding the upper side and the front and rear sides of the write word line 6. In this case, the magnetic material portion 2b has an upper end thereof in intimate contact with the underside surface of the magnetic material portion 2a without forming any gap therebetween. Further, similarly, the magnetic material portion 2c as well has a lower end thereof in intimate contact with the top surface of the magnetic material portion 2a without forming any gap therebetween. It should be noted throughout the present specification, the notion of "intimate contact without forming any gap therebetween" includes not only a configuration in which the direct and intimate contact is established but also a configuration in which intimate contact is established via a slight oxidation layer and a slight impurity layer produced through a process for manufacturing the storage cell 1.

With this construction, the bit line 5 at the intersection is individually covered by an annular magnetic layer RM1 formed by the magnetic material portions 2a and 2b. Further, the write word line 6 at the intersection is also individually covered by an annular magnetic layer RM2 formed by the magnetic material portions 2a and 2c. Therefore, when electric current flow through the bit line 5 and the write word line 6, closed magnetic circuits for magnetic fields generated around the lines 5 and 6 are formed by the annular magnetic layer RM1 and RM2, respectively. It should be noted that insulating materials 3 are arranged between the bit line 5 and the annular magnetic layer RM1, and between the write word line 6 and the annular magnetic layer RM2, respectively, such that the bit line 5 and the write word line 6 are not directly joined to the magnetic material 2. Further, the annular magnetic layer RM1 of the magnetic material 2 is joined to the read word line 12 disposed along the write word line 6 and electrically connected to the read word line 12.

Further, the magnetic material 2 can be made of iron (Fe), a nickel-iron alloy (NiFe), cobalt (Co), a cobalt-iron alloy (CoFe), NiFeCo, or the like. It should be noted that to make it difficult for the magnetic fields generated around the bit line 5 and the write word line 6 at the intersection to leak to the outside of the magnetic material 2, it is preferable to make the magnetic permeability of the magnetic material 2 as high as possible. More specifically, preferably, the magnetic permeability of the magnetic material 2 is set to 2000 or more, more preferably to 6000 or more.

As shown in FIG. 3, the TMR element 20 is the laminate of a non-magnetic layer 21 for passing a tunnel current, a first magnetic layer 22 (hereinafter also referred to as "the magnetic layer 22"), and the magnetic material portion 2a which is a shared portion that the annular magnetic layers RM1 and RM2 have in common, and serves as a sensitive magnetic layer 23. The TMR element 20 is disposed between the bit line 5 and the write word line 6.

In this case, to cause the non-magnetic layer 21 to function as a tunnel barrier layer (insulating layer for causing a tunnel effect), a thickness thereof is determined based on tunnel resistance and the like. In general, in the magnetic memory device M employing TMR elements 20, it is considered appropriate that the tunnel resistance is several tens of $k\Omega \cdot (\mu m)^2$, so as to match the TMR elements 20 with semiconductor devices, such as transistors. However, to increase the density and operational speed of the magnetic memory device, it is preferable that the tunnel resistance is not higher than 10 $k\Omega \cdot (\mu m)^2$, and more preferably not higher than 1 $k\Omega \cdot (\mu m)^2$. Further, to attain the above tunnel resistance, it is preferable that the thickness of the non-magnetic layer 21 is not larger than 2 nm, more preferably not larger than 1.5 nm. However, when the thickness of the non-magnetic layer 21 is too small, although the value of the tunnel resistance can be decreased, a leakage current is generated due to asperities on a joint interface between the magnetic layer 22 and the sensitive magnetic layer 23, and hence there is a concern that the MR ratio is lowered. To prevent lowering of the MR ratio, it is necessary to form the non-magnetic layer 21 having a thickness large enough to inhibit a leakage current from flowing. More specifically, it is preferable that the non-magnetic layer 21 is formed to have a thickness of not smaller than 0.3 nm.

The magnetic layer 22, which serves as a so-called fixed layer, is formed by a material having a larger coercive force than that of the sensitive magnetic layer 23 such that the direction of magnetization is fixed in advance, and deposited on one side (lower side as viewed in FIG. 3) of the non-magnetic layer 21. In this case, since the magnetic layer 22 has a larger coercive force than that of the sensitive magnetic layer 23, the magnetization direction of the magnetic layer 22 is held constant for a long period of time without being adversely affected by the magnetization direction of the sensitive magnetic layer 23. Further, the magnetic layer 22 is formed e.g. of an cobalt-iron alloy (CoFe). However, this is not limitative, but the magnetic layer 22 can also be made of an element of cobalt (Co), a cobalt-platinum alloy (CoPt), a nickel-iron-cobalt alloy (NiFeCo), or the like.

Figure 4:
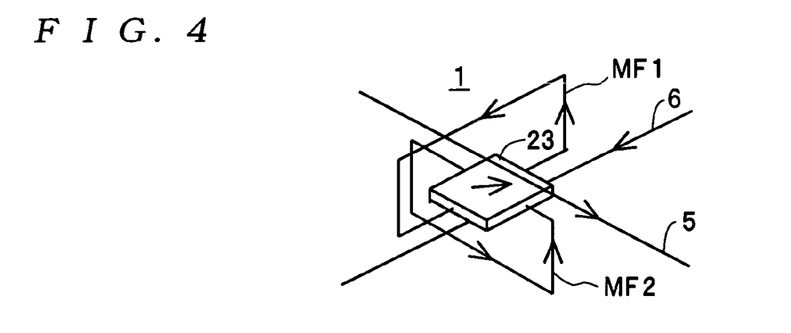
FIG. 4 is a diagram showing the principle of recording of information on a sensitive magnetic layer 23 by passing electric current through a bit line 5 and the write word line 6.

The sensitive magnetic layer 23 serves as a so-called free layer, and is deposited on the other side of the non-magnetic layer 21 (on the side opposite to the magnetic layer 22, an upper side as viewed in FIG. 3). As described above, the sensitive magnetic layer 23 is formed by the shared portion (magnetic material portion 2a) of the annular magnetic layer RM1 formed around the bit line 5 and the annular magnetic layer RM2 formed around the write word line 6. Therefore, as shown in FIG. 4, when electric currents are passed through the bit line 5 and the write word line 6 in directions indicated by arrows in FIG. 4, the synthetic magnetic field of a magnetic field MF1 generated in a closed magnetic circuit formed by the annular magnetic layer RM1, and a magnetic field MF2 generated in a closed magnetic circuit formed by the annular magnetic layer RM2 is generated in the sensitive magnetic layer 23, whereby the sensitive magnetic layer 23 is magnetized in the direction of the synthetic magnetic field (see directions indicated by arrows in FIGS. 3 and 4). This enables information stored in the storage cell 1 to be read out by detecting a direction in which the sensitive magnetic layer 23 is magnetized.

The magnetic layer 22 is electrically connected to the bit line 5, and the sensitive magnetic layer 23 is formed by the magnetic material portion 2a of the magnetic material 2, whereby the TMR element 20 is constituted in a manner sandwiched between the bit line 5 and the write word line 6. Further, the magnetic layer 22 and the magnetic material 2 (including the sensitive magnetic layer 23), except for the non-magnetic layer 21, are all made of conductive materials. As a result, when a voltage is applied between the bit line 5 and the read word line 12, the bit line 5 is electrically connected to the magnetic material 2 via the TMR element 20, so that electric current flows through the TMR element 20 in a direction perpendicular to the laminating surfaces thereof (vertical direction as viewed in FIG. 3).

Next, a description will be given of a write operation in the magnetic memory device M.

In the magnetic memory device M, first, the address buffer 51 fetches address data input via the external data terminals A0 to A20, amplifies the address data in an internal buffer thereof, and transmits the amplified address data to the Y-direction and X-direction address decoders 56A and 58A via the address lines 55 and 57, respectively. Simultaneously, the data buffer 52 fetches write data input via the external data terminals D0 to D7, amplifies the write data in an internal buffer thereof, and transmits the amplified write data to the Y-direction and X-direction current drives 56C and 58C via the data buses 60 and 61 for use in writing, respectively.

On the other hand, the address decoders 56A and 58A select, based on the address data, a bit line 5 and a write word line 6 having respective decoded values corresponding to the address data. In this case, the directions of electric currents to be passed through the bit line 5 and the write word line 6 are determined based on write data by the current drives 56C and 58C. Further, the control logic section 53 delivers the write enable signal to the Y-direction grounding circuit 56D, to thereby shift the respective transistors TR to a conduction state. As a result, a storage cell 1 where electric currents flow through both the bit line 5 and the write word line 6 is uniquely selected, and predetermined bit data (write data) is written in the storage cell 1.

Next, a description will be given of a read operation in the magnetic memory device M.

In the magnetic memory device M, first, the address buffer 51 fetches address data via the external data terminals A0 to A20, amplifies the address data in the internal buffer thereof, and transmits the amplified address data to the Y-direction and X-direction address decoders 56A and 58A via the address lines 55 and 57, respectively. On the other hand, the address decoders 56A and 58A select, based on the address data, a bit line 5 and a read word line 12 having respective decoded values corresponding to the address data. Further, during the read operation, the control logic section 53 stops delivery of the write enable signal to the Y-direction grounding circuit 56D, to thereby shift the transistors TR to a non-conduction state. Further, the sense amplifier 56B starts application of a predetermined voltage to the selected bit line 5 via an electric current-detecting resistance contained therein. On the other hand, the X-direction grounding circuit 58B connects the selected read word line 12 to the ground via a transistor contained therein. This causes read current to flow through the sense amplifier 56B, the selected bit line 5, a TMR element 20 within a storage cell 1 at an intersection where the bit line 5 and the selected read word line 12 intersect with each other, a magnetic material 2 of the storage cell 1, the read word line 12, and the X-direction grounding circuit 58B. In this case, the internal resistance of the TMR element 20 is largely different depending on the combination of the directions of magnetization in the two magnetic layers 22 and 23. Consequently, the value of electric current flowing through the above flow path is changed according to the details of information stored in the TMR element 20, and hence the sense amplifier 56B outputs readout data associated with the details (1 or 0) of data (information) stored in the storage cell 1 to the data buffer 52 via the data bus 62 for reading, based on the magnitude of voltage (i.e. the magnitude of electric current flowing through the electric current-detecting resistance) generated between opposite ends of the electric current-detecting resistance contained in the sense amplifier 56B. Then, the readout data output to the data buffer 52 is read out by an external device via the external data terminals D0 to D7 of the data buffer 52.

As described above, according to the magnetic memory device M, the magnetic material 2 for forming the annular magnetic layers RM1 and RM2 individually covering the bit line 5 and the write word line 6 at each intersection the bit line 5 and the write word line 6 intersect with each other is disposed at the intersection, and at the same time the sensitive magnetic layer 23 of the TMR element 20 is formed by the shared portion (magnetic material portion 2a) of the annular magnetic layers RM1 and RM2. As a result, magnetic fluxes generated around the bit line 5 and the write word line 6 by electric currents flowing through the lines 5 and 6 can be confined within the annular magnetic layers RM1 and RM2 (closed magnetic circuits). This makes it possible to reduce occurrence of leakage fluxes, thereby making it possible to largely reduce adverse influence of leakage fluxes on adjacent storage cells 1. In short, according to the magnetic memory device M, it is possible to obtain a high electromagnetic shielding effect. Further, in the magnetic memory device M, the sensitive magnetic layer 23 is formed by the shared portion (magnetic material portion 2a) of the annular magnetic layers RM1 and RM2 covering the respective peripheries of the bit line 5 and the write word line 6. As a result, according to the magnetic memory device M, it is possible to reduce occurrence of leakage fluxes, as described above, and therefore the internal magnetic flux of the magnetic material 2, increased in density, can be efficiently transmitted to the sensitive magnetic layer 23, thereby making it possible to efficiently change the magnetization direction of the sensitive magnetic layer 23.

Figure 5:
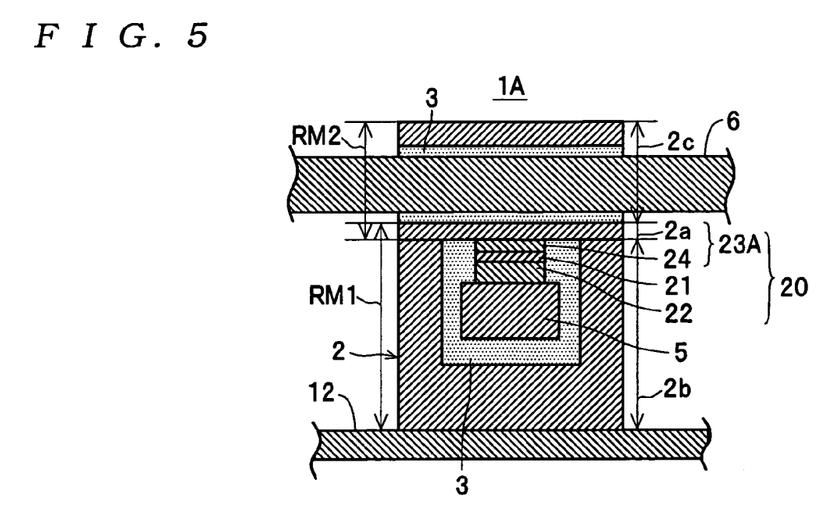
FIG. 5 is a cross-sectional view showing the arrangement of another storage cell 1A.

It should be noted that the present invention is by no means limited to the above-described embodiment. For example, although in the above-described magnetic memory device M, the description has been given, by way of example, of the case where there is employed the storage cell 1 in which the sensitive magnetic layer 23 of the TMR element 20 is formed only by the shared portion (magnetic material portion 2a) of the annular magnetic layers RM1 and RM2 individually covering the bit line 5 and the write word line 6, this is not limitative, but as shown in FIG. 5, it is also possible to construct a storage cell 1A, by way of example, in which a magnetic layer 24 formed by a conductive magnetic material and magnetically exchange-coupled with the magnetic material portion 2a is disposed between the non-magnetic layer 21 and the magnetic material portion 2a. In this case, a sensitive magnetic layer 23A is formed by the magnetic layer 24 and the magnetic material portion 2a. According to this storage cell 1A, a material having a high polarizability can be selected as a material forming the magnetic layer 24 which is one of the members forming the sensitive magnetic layer 23A, and hence it is possible to increase the rate of change in MR of the TMR element 20. Further, it is preferable to form the magnetic layer 24 using a material having a larger coercive force than that of the magnetic material portion 2a. This construction makes it possible to make the magnetization direction of the magnetic layer 24 more stable. In this case, the term "coercive force of the magnetic material portion 2a" is intended to mean the coercive force of the magnetic material portion 2a obtained assuming the shape of a portion in contact with the laminate or that of a portion onto which the shape of the laminate is projected. Further, according to this construction, the magnetic layer 24 and the non-magnetic insulating layer 21 forming the tunnel barrier layer can be continuously formed in the same chamber in a process for forming the TMR element 20, so that it is possible to prevent an interface between the magnetic layer 24 and the non-magnetic insulating layer 21 from being polluted by other elements. As a result, it is possible to increase the rate of change in MR of the TMR element 20.

Figure 6:
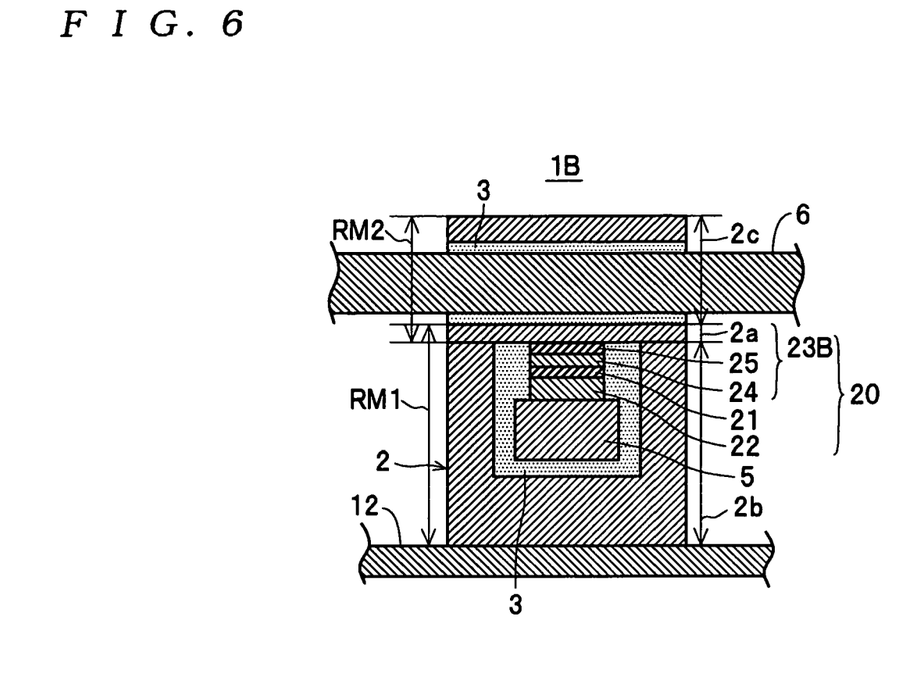
FIG. 6 is a cross-sectional view showing the arrangement of another storage cell 1B.

Furthermore, as shown in FIG. 6, it is also possible to employ a storage cell 1B in which a sensitive magnetic layer 23B is formed by depositing a non-magnetic conductive layer 25 and the magnetic layer 24 each in the form of a thin film on the magnetic material portion 2a in the mentioned order, such that the magnetic layer 24 can be antiferromagnetically coupled with the magnetic material portion 2a. In this case, the sensitive magnetic layer 23B is formed by the magnetic material portion 2a, the magnetic layer 24, and the non-magnetic conductive layer 25. According to this storage cell 1B, it is possible not only to obtain the effect provided by the above examples but also to further stabilize the magnetization direction of the magnetic layer 24.

Figure 7:
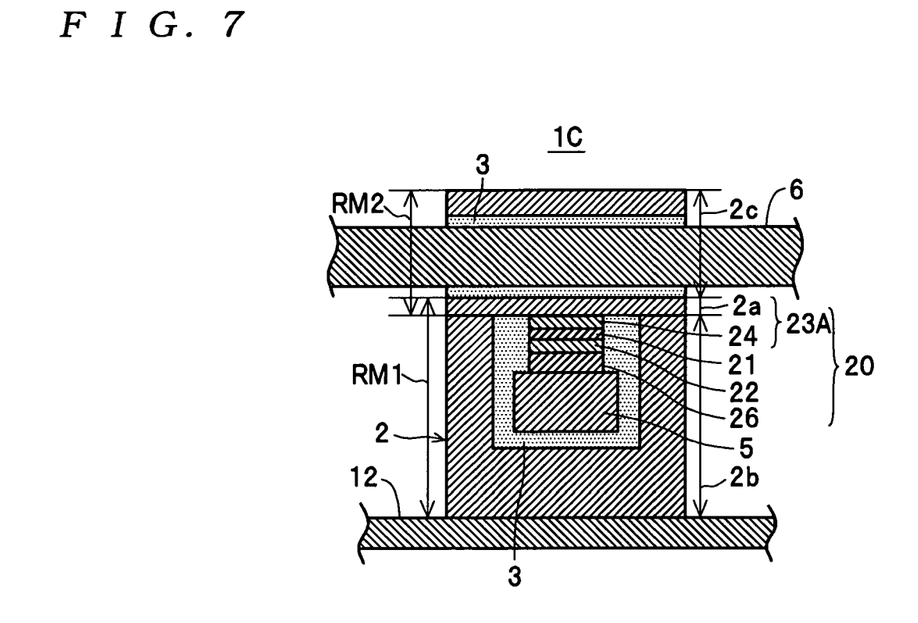
FIG. 7 is a cross-sectional view showing the arrangement of another storage cell 1C.

Further, as shown in FIG. 7, it is also possible to employ a storage cell 1C in which the TMR element 20 is formed as a laminate having a spin valve structure by disposing (depositing) an antiferromagnetic and conductive magnetic layer (second magnetic layer) 26 exchange-coupled with the magnetic layer 22 on a side of the magnetic layer 22 opposite from the non-magnetic layer 21, as distinct from the construction of the above-described storage cell 1A. According to this storage cell 1C, the magnetization direction of the magnetic layer 22 can be more stably held fixed. Although not shown, the construction in which the conductive magnetic layer 26 is disposed can be similarly applied to the storage cell 1.

Figure 8:
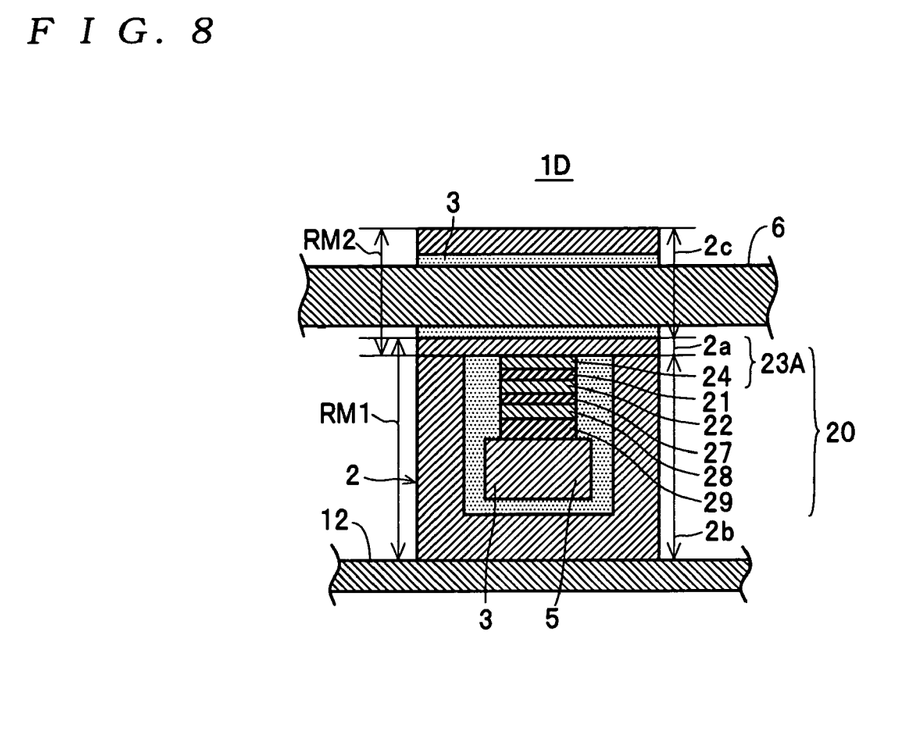
FIG. 8 is a cross-sectional view showing the arrangement of another storage cell 1D.

Further, as shown in FIG. 8, it is also possible to construct a storage cell 1D in which as distinct from the construction of the above-described storage cell 1A, the TMR element 20 is formed by depositing a ferromagnetic and conductive magnetic layer (third magnetic layer) 28 which is antiferromagnetically coupled with the magnetic layer 22, via a non-magnetic conductive layer 27, on the side of the magnetic layer 22 opposite from the non-magnetic layer 21, and at the same time by depositing an antiferromagnetic layer (fourth magnetic layer) 29 which is exchange-coupled with the magnetic layer 28 on a side of the magnetic layer 28 opposite from the magnetic layer 22. According to this storage cell 1D, it is possible to reduce the influence of a static magnetic field from the magnetic layer 22 to the sensitive magnetic layer 23A, and hence the magnetization direction of the sensitive magnetic layer 23A can be efficiently changed. Further, since the magnetization direction of the magnetic layer 22 can be more stably held fixed, it is possible to increase the rate of change in MR of the TMR element 20. Although not shown, the construction in which the non-magnetic conductive layer 27, the magnetic layer 28, and the magnetic layer 29 are disposed can be similarly applied to the storage cells 1 and 1B.

Figure 9:
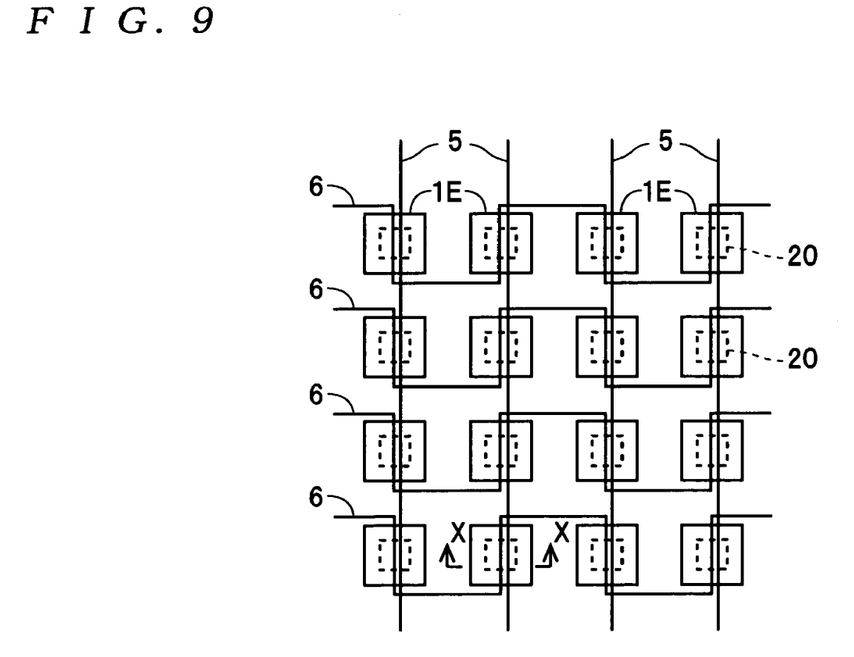
FIG. 9 is a plan view showing the arrangement of a storage cell group employing another storage cell 1E.
Figure 10:
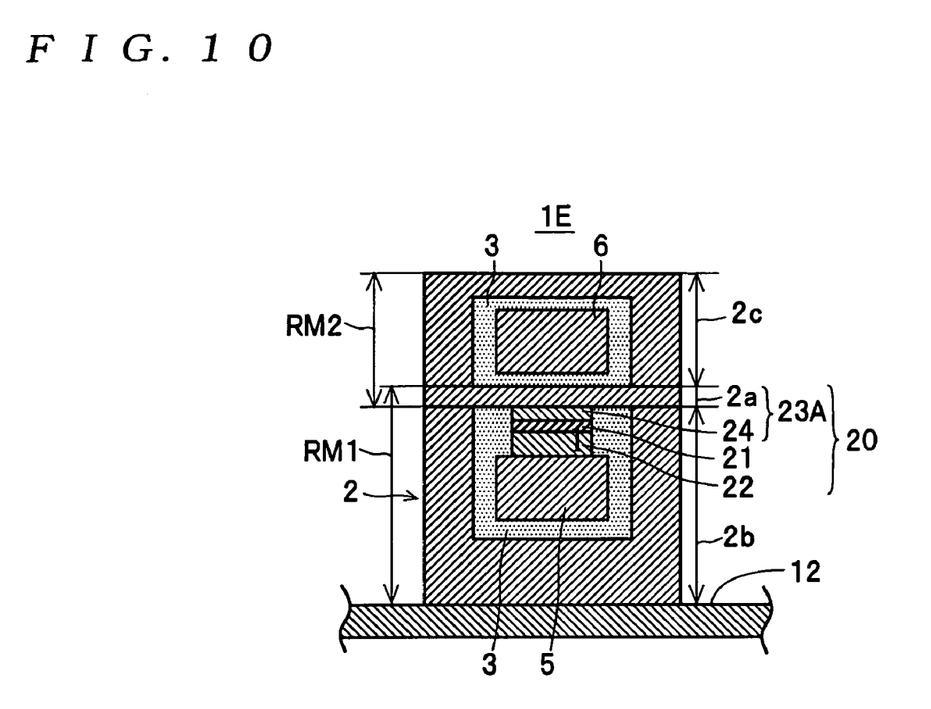
FIG. 10 is a cross-sectional view of the FIG. 9 storage cell 1E, taken on line X—X of FIG. 9.

Although in the above-described magnetic memory device M, the description has been given of the examples in which the bit line 5 and the write word line 6 intersect with each other at right angles at the portions where the storage cells 1, 1A, 1B, 1C and 1D, are disposed, this is not limitative, but the respective constructions of the storage cells 1, 1A, 1B, 1C and 1D can be applied to a storage cell 1E which is disposed at an intersection where the bit line 5 and the write word line 6 are configured to be parallel to each other, as shown in FIG. 9. In this case, as shown in FIG. 10, the storage cell 1E constructed e.g. based on the storage cell 1A is distinguished from the storage cell 1A only in that the annular magnetic layers RM1 and RM2 are arranged in intimate contact with the magnetic material portion 2a such that the annular magnetic layers RM1 and RM2 are parallel to each other, and the other components are the same as those of the storage cell 1A. Similarly to the storage cell 1A, in this construction as well, it is possible to invert the magnetization direction of the sensitive magnetic layer 23 using the synthetic magnetic field of magnetic fields generated by electric current flowing through the bit line 5 and the write word line 6. Further, similarly, storage cells constructed based on the constructions of the other storage cells 1, 1B, 1C, and 1D can provide the same advantageous effects as provided by the other storage cells 1, 1B, 1C, and 1D.

INDUSTRIAL APPLICABILITY

As described hereinabove, according to the present magnetoresistive effect element, a magnetic material is disposed which individually covers a first write line and a second write line at an intersection where the first and second write lines intersect with each other, thereby forming an annular magnetic layer associated with the first write line and an annular magnetic layer associated with the second write line, and a sensitive magnetic layer is formed such that it includes a shared portion of the annular magnetic layers. Therefore, magnetic fluxes generated around the first and second write lines by electric currents flowing therethrough can be confined within closed magnetic circuits formed by the respective annular magnetic layers. This makes it possible to realize a magnetoresistive effect element which is capable of reducing occurrence of leakage fluxes, thereby largely reducing adverse influence of leakage fluxes on adjacent magnetoresistive effect elements.

The invention claimed is:

1. A magnetoresistive effect element comprising:
 a laminate that is disposed at an intersection where a first write line and a second write line intersect with each other, in a manner sandwiched between the first write line and the second write line, said laminate including a sensitive magnetic layer whose magnetization direction is changed by a synthetic magnetic field of magnetic fields generated around the first write line and the second write line, and at the same time being configured such that electric current flows in a direction perpendicular to laminating surfaces thereof; and
 a magnetic material that individually covers the first write line and the second write line at the intersection, thereby forming an annular magnetic layer associated with the first write line and an annular magnetic layer associated with the second write line,
 wherein:
 the sensitive magnetic layer includes a shared portion of said annular magnetic layers of said magnetic material, said shared portion being sandwiched by the first write line and the second write line;
 said laminate is configured to include a non-magnetic layer, a first magnetic layer deposited on one side of said non-magnetic layer and having a fixed magnetization direction, said sensitive magnetic layer deposited on a side of said non-magnetic layer opposite from said first magnetic layer, and a second magnetic layer that is deposited on a side of said first magnetic layer opposite from said non-magnetic layer and is exchange-coupled with said first magnetic layer, said second magnetic layer having an antiferromagnetic property; and
 information can be read out based on the electric current.

2. A magnetoresistive effect element comprising:
 a laminate that is disposed at an intersection where a first write line and a second write line intersect with each other, in a manner sandwiched between the first write line and the second write line, said laminate including a sensitive magnetic layer whose magnetization direction is chanced by a synthetic magnetic field of magnetic fields generated around the first write line and the second write line, and at the same time being configured such that electric current flows in a direction perpendicular to laminating surfaces thereof; and
 a magnetic material that individually covers the first write line and the second write line at the intersection, thereby forming an annular magnetic layer associated with the first write line and an annular magnetic layer associated with the second write line,
 wherein: the sensitive magnetic layer includes a shared portion of said annular magnetic layers of said magnetic material, said shared portion being sandwiched by the first write line and the second write line;
 said laminate is configured to include a non-magnetic layer, a first magnetic layer deposited on one side of said non-magnetic layer and having a fixed magnetization direction, said sensitive magnetic layer deposited on a side of said non-magnetic layer opposite from said first magnetic layer, a third magnetic layer that is deposited on a side of said first magnetic layer opposite from said non-magnetic layer via a non-magnetic conductive layer and is antiferromagnetically coupled with said first magnetic layer, said third magnetic layer having a ferromagnetic property, and a fourth magnetic layer that is deposited on a side of said third magnetic layer opposite from said first magnetic layer and is exchange-coupled with said third magnetic layer, said fourth magnetic layer having an antiferromagnetic property; and
 information can be read out based on the electric current.

* * * * *

UNITED STATES PATENT AND TRADEMARK OFFICE
CERTIFICATE OF CORRECTION

| | | |
|---|---|---|
| PATENT NO. | : 7,227,771 B2 | Page 1 of 1 |
| APPLICATION NO. | : 10/548830 | |
| DATED | : June 5, 2007 | |
| INVENTOR(S) | : Ezaki et al. | |

It is certified that error appears in the above-identified patent and that said Letters Patent is hereby corrected as shown below:

At column 14, line 33 (claim 2, line 7) "is chanced by" should be --is changed by--.

Signed and Sealed this

Fifteenth Day of April, 2008

JON W. DUDAS
*Director of the United States Patent and Trademark Office*